United States Patent
Newhouse et al.

(10) Patent No.: US 9,320,172 B2
(45) Date of Patent: Apr. 19, 2016

(54) SPACING-SAVING THERMAL MANAGEMENT SYSTEM FOR ELECTRONIC DEVICES

(71) Applicant: Ciena Corporation, Hanover, MD (US)

(72) Inventors: Todd Andrew Newhouse, Rohnert Park, CA (US); Colin John Wilson, Sebastopol, CA (US)

(73) Assignee: Ciena Corporation, Hanover, MD (US)

( * ) Notice: Subject to any disclaimer, the term of this patent is extended or adjusted under 35 U.S.C. 154(b) by 229 days.

(21) Appl. No.: 14/042,186

(22) Filed: Sep. 30, 2013

(65) Prior Publication Data

US 2015/0092348 A1    Apr. 2, 2015

(51) Int. Cl.
H05K 7/20 (2006.01)
F28D 15/02 (2006.01)
F28D 15/04 (2006.01)

(52) U.S. Cl.
CPC ............ H05K 7/20336 (2013.01); F28D 15/02 (2013.01); F28D 15/04 (2013.01); H05K 7/20727 (2013.01); H05K 7/20809 (2013.01)

(58) Field of Classification Search
CPC .......... H05K 7/20336; H05K 7/20409; H05K 7/20136; H05K 7/20218; H05K 13/0023; H05K 7/20318; F28D 15/02; H04B 10/27; H04B 10/2575
USPC ............... 361/679.46–679.54, 695, 699, 700; 454/184
See application file for complete search history.

(56) References Cited

U.S. PATENT DOCUMENTS

| | | | |
|---|---|---|---|
| 5,930,113 A | | 7/1999 | McCann |
| 6,466,441 B1 | | 10/2002 | Suzuki |
| 7,342,788 B2 | | 3/2008 | Nikfar |
| 7,470,139 B2 * | | 12/2008 | Miki et al. ..................... 439/354 |
| 8,958,203 B2 * | | 2/2015 | Yang ......................... G06F 1/20 312/236 |
| 2003/0057546 A1 * | | 3/2003 | Memory ............ H05K 7/20681 257/706 |
| 2011/0013114 A1 * | | 1/2011 | Dunn ................ G02F 1/133385 349/61 |
| 2013/0058695 A1 * | | 3/2013 | Jensen ............... H05K 7/20436 400/76 |
| 2013/0136446 A1 | | 5/2013 | Hotchkiss |
| 2013/0314876 A1 * | | 11/2013 | Martin ................. H05K 7/1432 361/714 |
| 2014/0029200 A1 * | | 1/2014 | Annacchino ....... H05K 7/20936 361/700 |
| 2014/0118920 A1 * | | 5/2014 | Ng ............................ G06F 1/20 361/679.33 |
| 2014/0160679 A1 * | | 6/2014 | Kelty ................. H05K 7/20672 361/700 |
| 2014/0198452 A1 * | | 7/2014 | Brunschwiler .... H05K 13/0023 361/699 |
| 2014/0240930 A1 * | | 8/2014 | Arvelo ................. H05K 7/2039 361/721 |
| 2015/0117860 A1 * | | 4/2015 | Braun ................. H04J 14/0282 398/58 |

* cited by examiner

*Primary Examiner* — Jayprakash N Gandhi
*Assistant Examiner* — Matt Dhillon
(74) *Attorney, Agent, or Firm* — Christopher L. Bernard; Lawrence A. Baratta, Jr.; Clements Bernard PLLC (57) ABSTRACT

A thermal management system includes a distributor plate secured to and parallel to a circuit board. The circuit board has a module secured thereto and the distributor plate defines an area on an inner surface thereof secured to or otherwise in thermal contact with the module. Heat pipes embedded in the distributor plate include a portion over the module and a portion over the circuit board outward from the module. A portion of the heat pipes outward from the module may be substantially perpendicular to a direction of airflow between the circuit board and distributor plate. The module may be located closer to one edge of the circuit board and the heat pipes may according extend from adjacent that edge to an opposite edge of the circuit board. An inward facing surface may include fins extending toward the circuit board and the fins may be contoured to the circuit board.

17 Claims, 8 Drawing Sheets

SPACING-SAVING THERMAL MANAGEMENT SYSTEM FOR ELECTRONIC DEVICES

TECHNICAL FIELD

This invention relates to systems and methods for cooling electronic devices, and, more particularly, to electronic devices secured to a card mountable in a chassis of a computing device.

BACKGROUND

In many instances, a critical problem in the design of an electronic device is dealing with the large amounts of heat generated by electronic devices. As the size of silicon transistors gets smaller and smaller, the heat generated per unit volume in the silicon also increases.

As an example, an industry standard 100 G Long Haul Dense Wave Division Multiplexing (DWDM) module (known as the 100 GLH MSA (multi-source agreement) module) generates from 90 to 100 Watts of heat in a 5 inch by 7 inch foot print. In order to deal with this heat, a tall heat sink and high airflow are used. However, the tall heat sink extends outwardly from the module into an adjacent slot in a chassis in which the module is mounted, thereby reducing the number of slots available for other components.

The thermal management system disclosed herein provides an improved approach to cooling electronic components, particularly the 100 GLH MSA module.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the embodiments disclosed herein provide an improved approach to removing heat from electronic components when space is limited.

Figure 1:
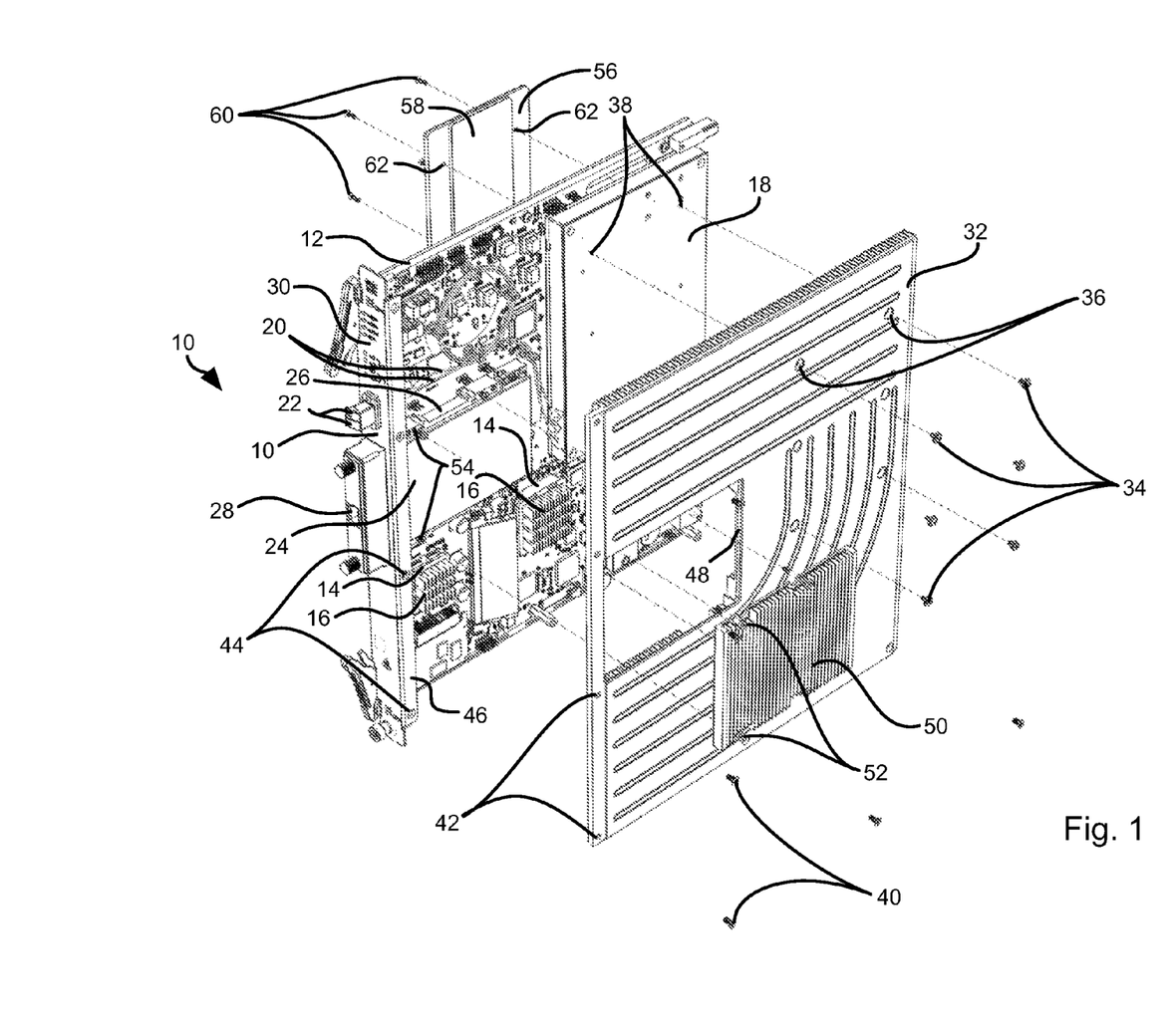
FIG. 1 is an exploded view of an electronic component incorporating a thermal management system in accordance with an embodiment of the present invention.
Figure 2:
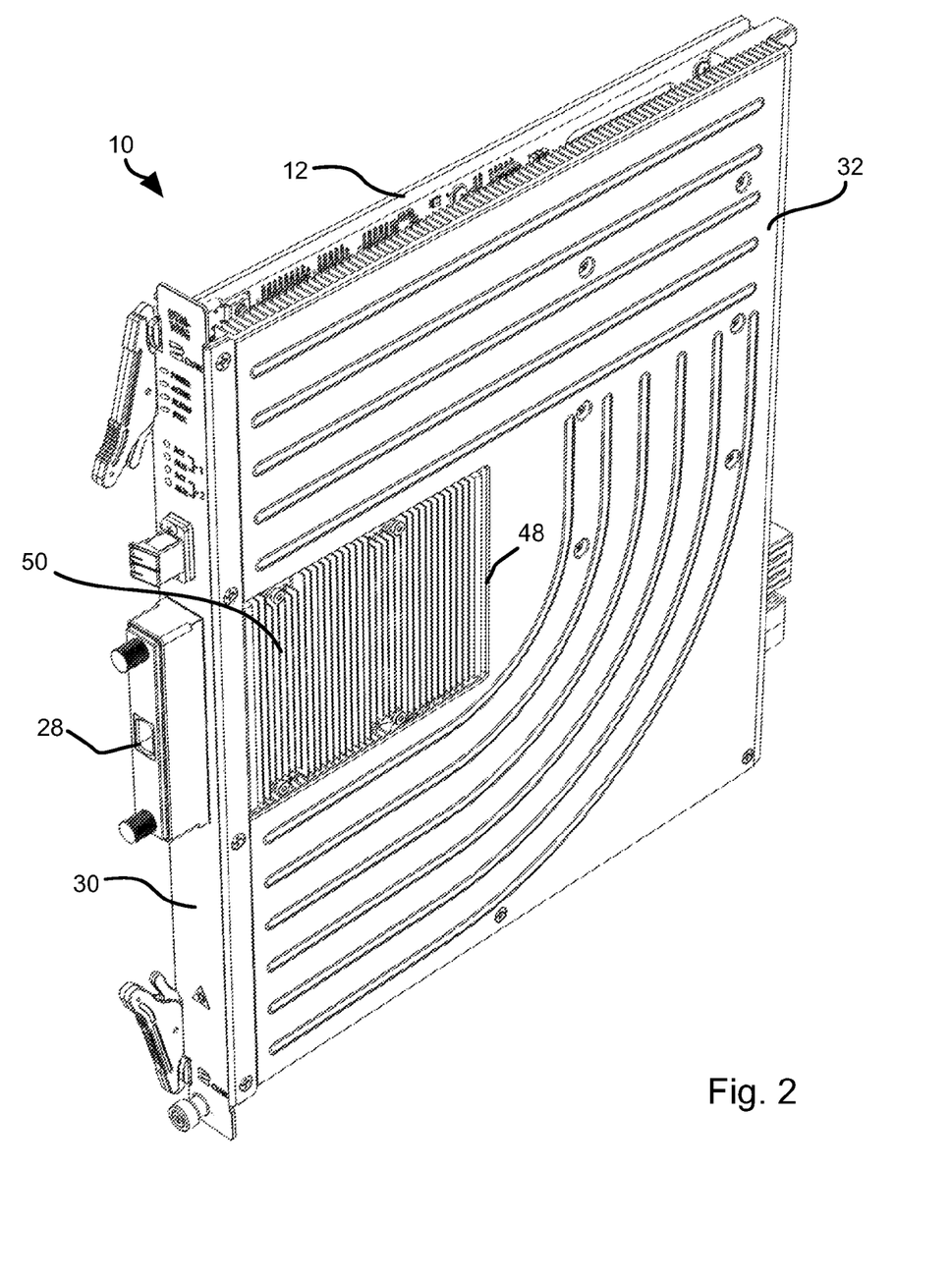
FIG. 2 is an isometric view of the electronic component and distributor plate of FIG. 1.

Referring to FIGS. 1 and 2, an electronic device 10 may include a circuit board 12 and one or more components 14 secured thereto. The components 14 may have individual heat sinks 16 secured thereto. The components 14 may be silicon chips or other device that generates heat during normal operation. Various other passive components (resistors, inductors, capacitors) and active components (transistors, chips, amplifiers, etc.) may also secure to the circuit board 12. In some embodiments, the device may include one or more modules 18 that use large amounts of power and consequently generate large amounts of heat. As noted above a 100G LH MSA module is such a component. However, the module 18 may also be any other heat-generating component, such as a general-purpose processor, graphics processing unit (GPU), or the like.

In the illustrated embodiment, the module 18 couples output signals to one or more optical fibers 20 connecting the module 18 to one or more output ports 22. The device 10 may define other ports as well. For example, the device 10 may include a transceiver 24 defining a port 28. For purposes of this disclosure the transceiver 24 may be an SFP (small form-factor pluggable) transceiver, XFP (a 10 Gbps version of an SFP) transceiver or a CFP (a 100 Gbps version of an SFP) transceiver. In the illustrated embodiment, the transceiver 24 is embodied as a CFP. The transceiver 24 may also be embodied as any other pluggable optical transceiver known in the art, such as the CFP2 and CFP4 modules that are still in the planning stage. The transceiver 34 may be pluggable into a receiver 26 mounted to the circuit board 12. The ports 22, 28 may protrude from or be accessible through a back plane 30 secured to the circuit board 12. The ports and types of ports shown are exemplary only. A device 12 including nay input or output port known in the art may benefit from the embodiments disclosed herein.

A distributor plate 32 secures over the circuit board 12 and is substantially coextensive therewith. For example, the distributor plate 32 may be parallel to the circuit board 12 and occupy substantially the same area in a plane parallel to the circuit board 12 as does the circuit board 12. For example, an amount by which the distributor plate 32 at the edges thereof extends outwardly or inwardly from a nearest edge of the circuit board 12 may be less than 10 percent, preferably less than 5 percent, and more preferably less than 1 percent of a longest dimension of the circuit board in the plane. As is apparent in the illustrated embodiment, the distributor plate 32 may have the exact dimensions (within manufacturing tolerances) of the circuit board 12 along one or more edges.

In some embodiments, particularly where the circuit board 12 is much larger than the module 18, the size and shape of the distributor plate 32 does not conform to the circuit board 12, but rather extends outwardly in at least one direction from the module 18.

The distributor plate 32 is in thermal contact with the module 18. To facilitate this contact, the distributor plate 32 may fasten directly to the module 18. For example, for the 100G LH MSA module, a standard pattern of fasteners for securing a heat sink to the module 18 is defined by the standard specification. Accordingly, the distributor plate 32 may secure to the module 18 using the same pattern of fasteners. For example, fasteners 34 (e.g. screws) may insert through holes 36 in the distributor plate and secure within holes (e.g. threaded holes) 38 defined by the module 18. The fasteners 34, e.g. pitch of threads, and the distribution thereof may conform to the industry specification for a heat sink fastener pattern for the module 18.

The distributor plate 32 may alternatively or additionally secure to the circuit board 12. For example, one or more fasteners 40 (e.g. screws) may insert through apertures 42 defined along an edge of the distributor plate 32 and engage holes 44 (e.g. threaded holes) defined by the back plane 30. In some embodiments, the holes 44 may be defined by a flange 46 of the back plane 30. The distributor plate 32 may additionally or alternatively secure to the circuit board 12 at various other locations.

The distributor plate 32 may define one or more apertures 48 to allow one or more heat sinks 50 secured to one or more other components mounted to the circuit board 12. For example, the illustrated heat sink 50 facilitates removing thermal energy from the transceiver 24. To that end, the heat sink 50 may be in thermal contact with the transceiver 24. For example, fasteners 52 may engage holes 54 (e.g. threaded holes) defined by the receiver 26 in which the transceiver 24 is secured, or some other part of the circuit board 12 or a structure secured to the circuit board 12.

In some embodiments, thermal energy may additionally be removed from the module 18 by a rear heat sink 56. The rear heat sink 56 may secure to the device 10 such that the circuit board 12 is positioned between the rear heat sink 56 and the module 18. The rear heat sink 56 may define a protrusion 58 sized to extend through the circuit board 12 into thermal contact with the module 18. All or part of the surface of the protrusion 58 facing the module 18 may be covered with a thermally conductive material (e.g. silicone polymer, thermal grease, or the like) that accommodates surface roughness or misalignment of the surface with respect to the module 18. Alternatively, a portion of the surface of the module 18 interfacing with the protrusion 58 is covered with the thermally conductive material.

The rear heat sink 56 may secure to one or both of the circuit board 12 and the module 18 by means of fasteners 60 (e.g. screws) extending through the rear heat sink 56 and engaging the circuit board 12 and/or module 18.

Figure 3:
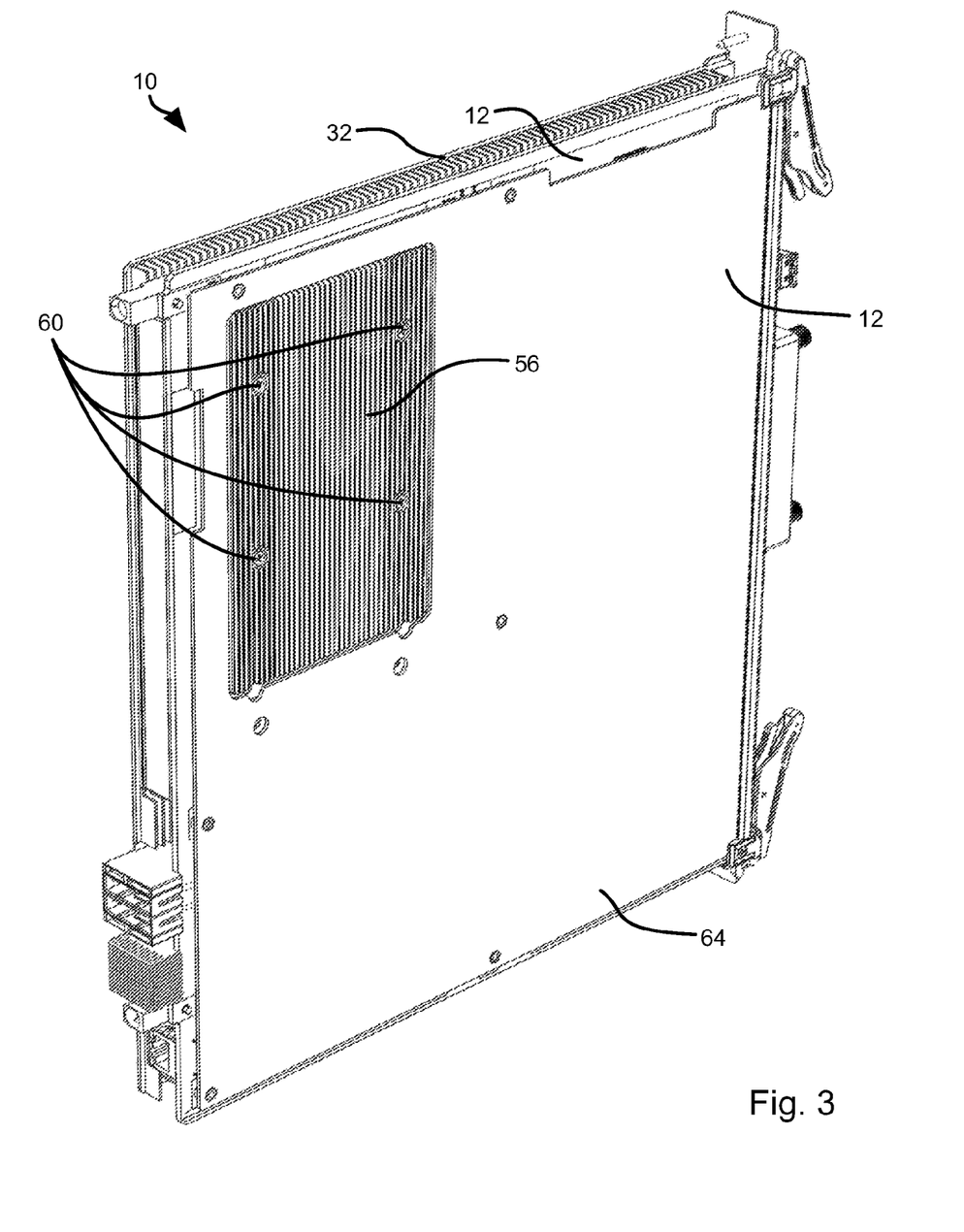
FIG. 3 is an isometric view of an opposite side of the electronic component and distributor plate of FIG. 1.
Figure 4:
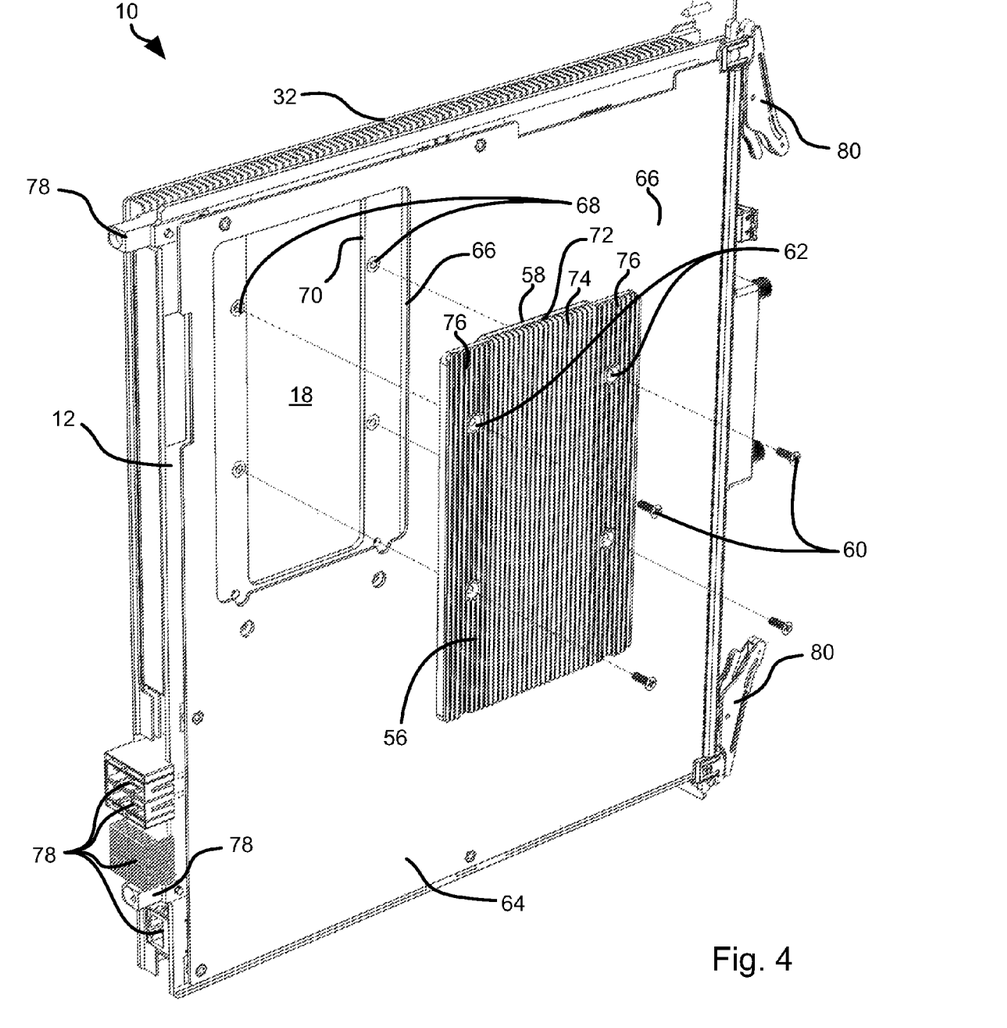
FIG. 4 is an exploded view of the opposite side of the electronic component and distributor plate of FIG. 1.

Referring to FIGS. 3 and 4, in some embodiments, the circuit board 12 may mount to a plate 64, such as a metal plate 64 that provides structural stiffness to the circuit board 12. The metal plate 64 may be parallel to the circuit board and may be substantially coextensive therewith. For example, an amount by which the plate 64 at the edges thereof extends outwardly or inwardly from a nearest edge of the circuit board 12 may be less than 10 percent, preferably less than 5 percent, and more preferably less than 1 percent of a longest dimension of the circuit board in a plane parallel to the circuit board 12.

The rear plate 64 may define an aperture 66 for receiving the protrusion. In the illustrated embodiment, the aperture 66 is sized to receive the entire heat sink 56, i.e. has a perimeter conforming to the perimeter of the heat sink 56 plus a gap to allow insertion into the aperture 66. The circuit board 12 may define apertures 68 or receiving the fasteners 62 and likewise define an aperture 70 for receiving the protrusion 58 such that the protrusion may be placed in thermal contact with the module 18.

In some embodiments, the protrusion 58 may have a corresponding recess 72 on an opposite side of the heat sink 56. In some embodiments, fins 74 of the heat sink 56 extending from the recess 72 may be longer than fins 76 adjacent the recess 72 such that the fins 74 are flush with one another in some plane, such as a plane parallel to the circuit board 12 when the heat sink 56 is secured thereto as described herein.

As is apparent in FIG. 4, the circuit board 12 may have one or more ports 78 coupled thereto and located opposite the backplane 30. These ports 78 may facilitate coupling of the device 10 to a device in which it is used, supplying power to the device 10, or perform some other function.

The plate 64 may secure within a slot of a chassis of a computer server rack, or some other device. One or more fasteners, such as quick-release, fasteners 80 may secure to one or both of the back plane 30 and the plate 64 in order to selectively secure the device 10 within a slot. The fasteners 80 may be any fastener known in the art for securing an electronic device 10 within a standardized slot.

Figure 5:
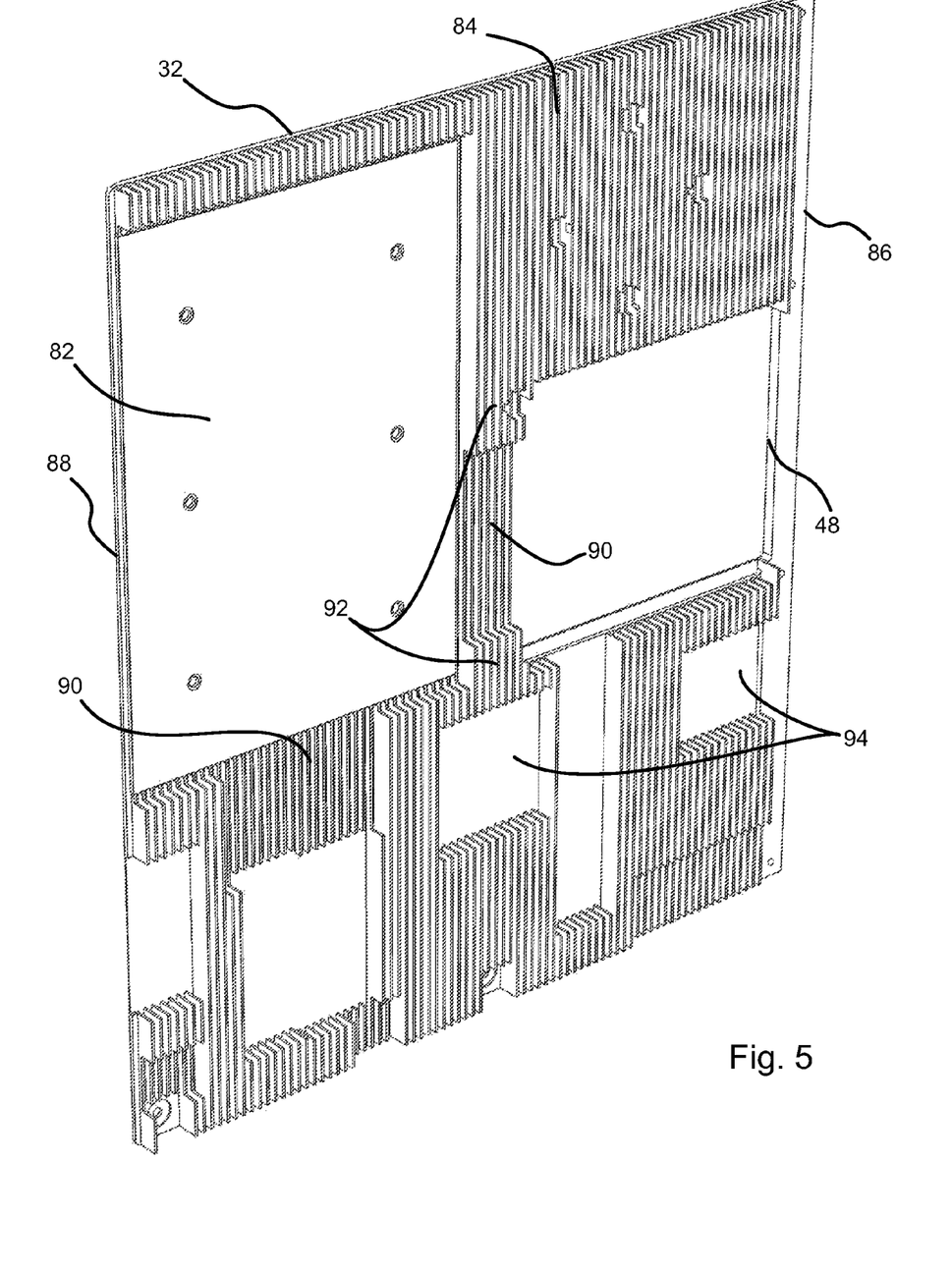
FIG. 5 is an isometric view of an inner surface of a distributor plate in accordance with an embodiment of the present invention.

FIG. 5 illustrates an inward facing surface of the distributor plate 32, i.e. facing the circuit board 12. The inward facing surface may define an area 82 corresponding to the module 18. The area 82 may be coated or covered with a thermally conducting layer, such as a silicone polymer layer, thermal grease, or the like. The area 82 may be sized substantially the same as the surface of the module 18 that engages it when the distributor plate 32 is secured to the module 18. For example, the area 82 may be sized to conform to the upper surface of the module 18 plus some tolerance (e.g. 0.1 to 1 mm, or the like) allowing free insertion of the module 18 into engagement with the area 82.

The area 82 may be defined as an area of the inward facing surface that is not occupied with fins 84. The distributor plate 32 may have a plurality of fins 84 extending therefrom toward the circuit board 12. The distributor plate 32 may define a first edge 86 located at the back plane 30 and an opposing second edge 88 parallel to the first edge. Each fin of at least a portion of the fins 84 may be substantially (e.g. within +/−5 degrees) aligned with one or both of the edges 86, 88, which may also correspond to a direction of air flow through the space between the circuit board 12 and the distributor plate 32.

As is apparent in FIG. 5 some fins 90, or portions 90, of fins 84 are shorter than other fins 92, or portions of fins 92. The varying height of the fins 84 may accommodate components secured to the circuit board 12. In some embodiments, one or more areas 94 of the inward facing surface may have no fins 84 secured thereto. Such areas may correspond to the location of components so tall there is no space for fins. For example, components 14 having their own heat sinks 16 secured thereto may have corresponding un-finned areas 94 positioned thereover when the distributor plate 32 is secured to the circuit board 12 as shown in FIGS. 1 through 4. In some embodiments, one or more of the un-finned areas 94 may be positioned over a power supply mounted to the circuit board 12 when the distributor plate is secured thereto. In such embodiments, this un-finned area 94 may have a covering of silicone polymer, thermal grease, or other highly thermally conductive material to facilitate transfer of heat from the power supply to that un-finned area 94.

Figure 6:
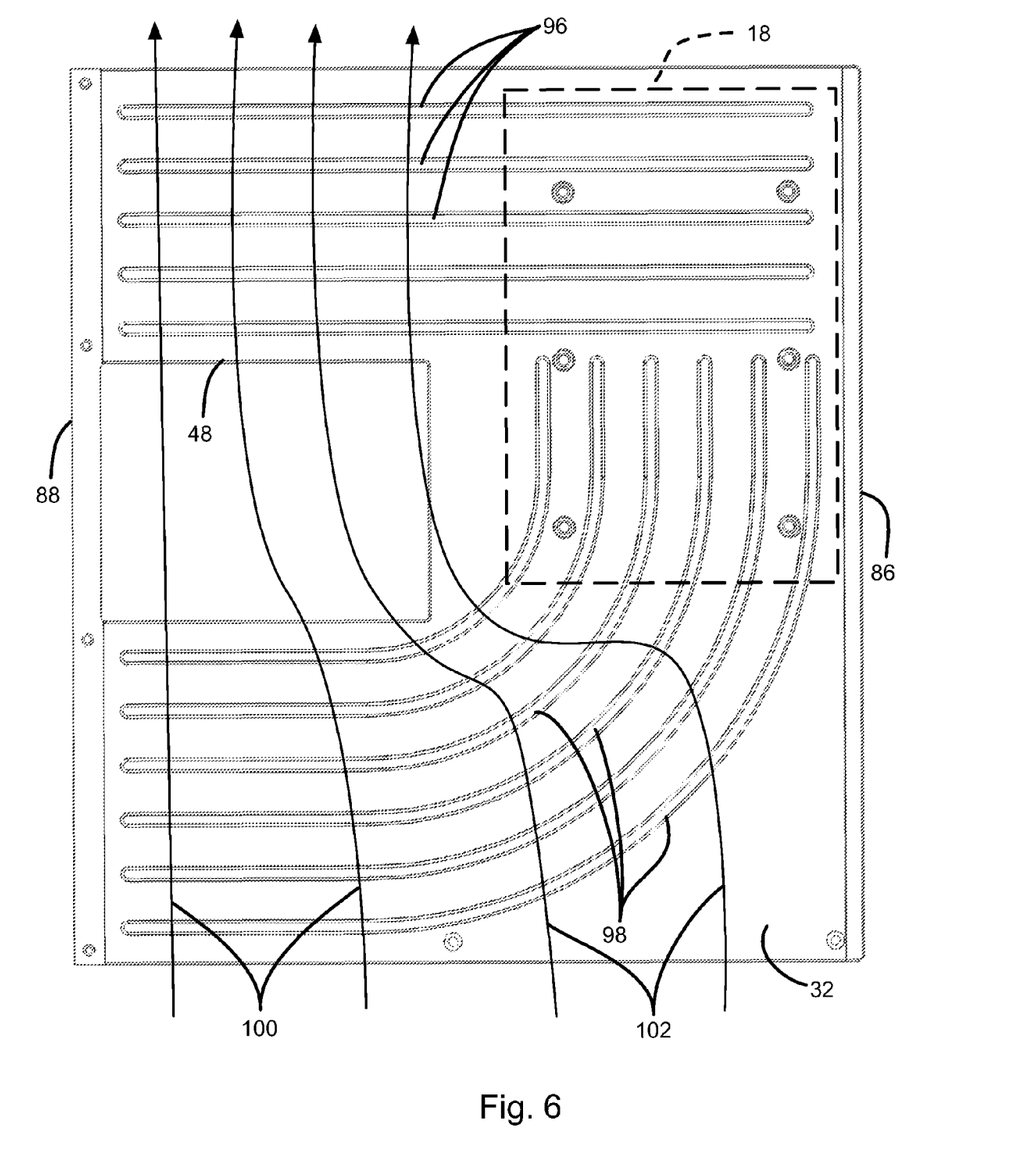
FIG. 6 is a side view of a distributor plate in accordance with an embodiment of the present invention.

Referring to FIG. 6, the distributor 32 may have a plurality of heat pipes 96, 98 secured thereto or embedded therein. The heat pipes 96, 98 may be any heat pipe known in the art. As known in the art, a heat pipe generally includes a channel or tube lined with a wicking material. The channel or tube is partially filled with a liquid that has a vaporization temperature within the range of operating temperatures of a device to be cooled. The wicking material draws the liquid to areas of the tube or channel where the liquid has been vaporized (a hotter end of the pipe) and the vapor condenses at a cooler end of the pipe. The heat of vaporization of the liquid is therefore used to absorb heat at the hot end and release heat at the cool end.

The heat pipes 96, 98 extend from over the module 18 to areas of the distributor 32 that are not positioned over the module 18. For example, the heat pipes 96, 98 may have between 30 and 70 percent of the length thereof over the module 18 and between 30 and 70 percent of the length thereof positioned over other areas of the circuit board 12. In some applications, the module 18 is positioned closer to one edge 86 of the distributor plate 32. Accordingly, the heat pipes 96, 98 may extend from proximate the edge 86 to proximate the edge 88. For example, where the distance between the edges 86, 88 along a direction perpendicular to the edges is X, the portions of one or more heat pipe 96, 98 closest to one or both edges 86, 88 may be within 10 percent of X from that edge 86, 88, preferably 5 percent, and more preferably 2 percent.

The module 18 may substantially prevent airflow thereacross between the distributor plate 32 and the circuit board 12. Accordingly, a portion of airflow 100 through the gap between the distributor plate 32 and circuit board 12 that is not incident on the module 18 may flow through unobstructed. In contrast, airflow 102 incident on the module 18 may be directed away from the module 18. By routing the heat pipes 96, 98 toward the edge 88, at least a portion of each heat pipe 96, 98 is positioned along the path of airflow 100 and airflow 102. At least a portion of the heat pipes 96, 98, e.g. between 30 and 70 percent thereof, may be substantially perpendicular to the direction of the un-obstructed air flow, e.g. within 20 degrees, preferably 10 degrees, and more preferably 5 degrees, of perpendicular.

In the illustrated embodiment, the heat pipes 96 are perpendicular to the edges 86, 88 and extend to one side of the aperture 48. The heat pipes 98 include a first portion positioned on a first side of the distributor plate 32 over the module 18, the first portion being parallel to the edges 86, 88 and a second portion positioned on an opposite side of the plate 32 is perpendicular to the edges 86, 88 and extends along an opposite side of the aperture 48. Curved portions of the heat pipes 98 connect the first and second portions as shown.

The illustrated configuration is one example of a configuration of heat pipes 96, 98. Other configurations may also be used. In particular, where the module 18 is positioned more centrally on the circuit board 12, heat pipes 96, 98 may extend form over the module 18 toward both edges 86, 88 to within the above noted proximity to the edges 86, 88.

Figure 7:
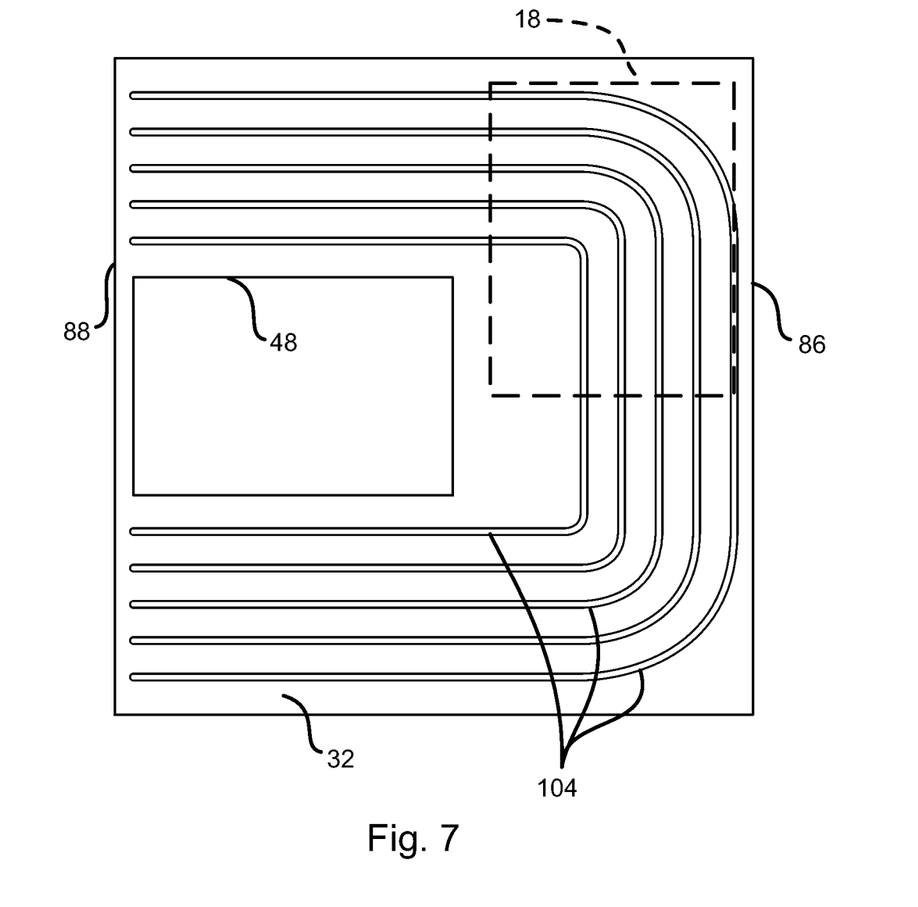
FIG. 7 is a side view of an alternative embodiment of a distributor plate in accordance with an embodiment of the present invention.

Referring to FIG. 7, in an alternative embodiment, a plurality of heat pipes 104 may have both ends located on a side of the distributor plate including the edge 88 and a portion of each heat pipe 104 between the ends extending across the module 18. For example, the heat pipes 104 may be U-shaped with the bottom of the U closer to the edge 86 and the legs of the U extending toward the edge 88.

Figure 8:
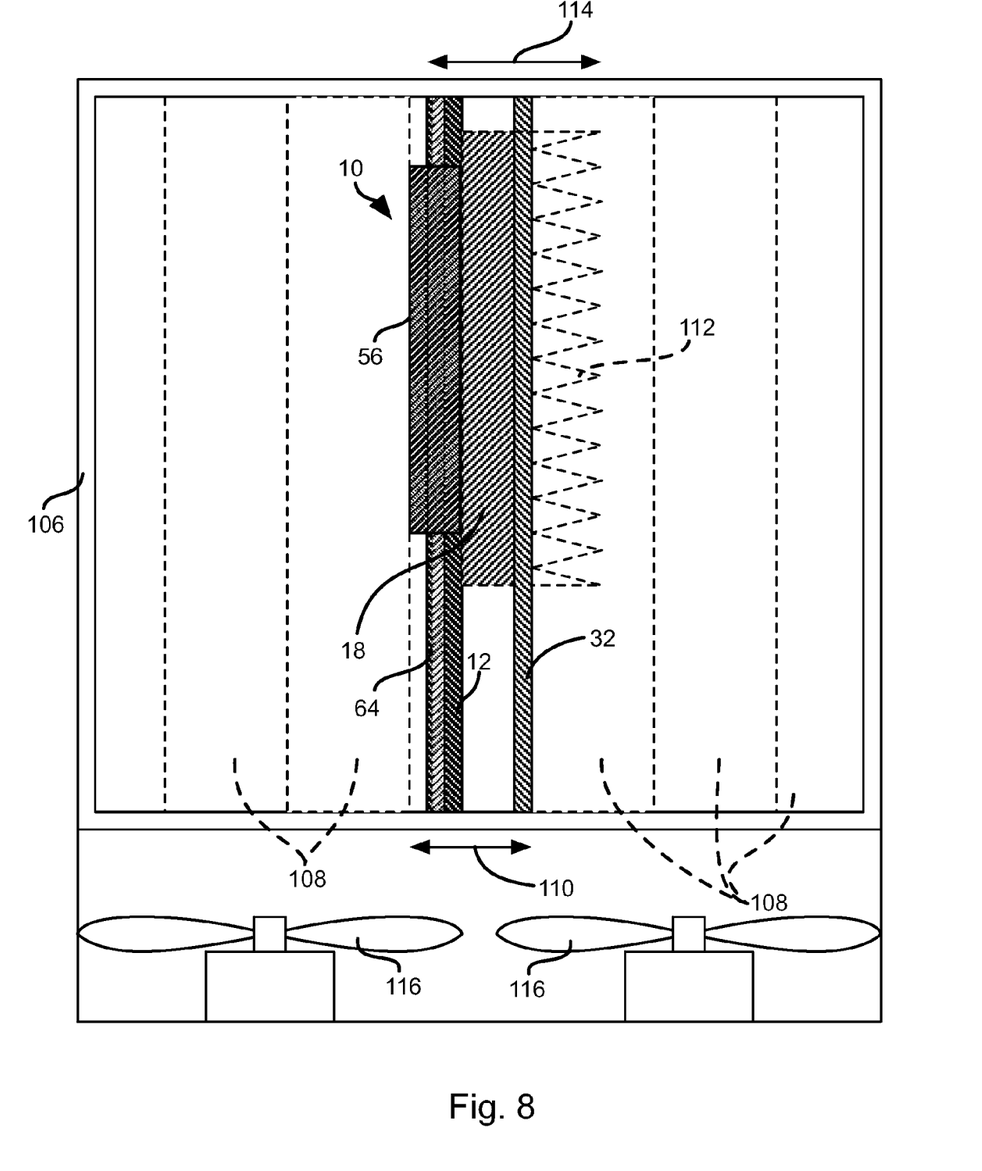
FIG. 8 is a rear view of a chassis incorporating an electronic component and distributor plate in accordance with an embodiment of the present invention.

Referring to FIG. 8, the device 10 may be inserted within a chassis 106, such as a computer chassis, server rack, or the like. The chassis 106 may define a plurality of slots defining a slot width or pitch 110. For example, the slots 108 may conform to the ATCA (Advanced Telecommunications Computing Architecture) specification, which has a pitch 110 of 1.2 inches.

The distributor plate 32 disclosed herein advantageously eliminates the need for a finned heat sink 112 secured to the module 18 with the fins extending outwardly from the module as shown. The heat sink 112 would increase the width 114 and cause the device 10 to occupy multiple slots 108. Accordingly, more devices can be placed within a single chassis 106 while still meeting the cooling needs of each device.

FIG. 8 shows a number of fans 116 located at the bottom of the chassis and forcing air up through the device 10, e.g. along the long axis of the fins 84 secured to the distributor plate 32. The fans 116 may have any configuration and may force air up through the device 10, draw air down through the device 10 (e.g. the opposite of what is shown in FIG. 6). The fans 116 may additionally be positioned above the device 10 and either force air down through the device 10 or draw air up through the device 10.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A thermal management system comprising:
   a plurality of components secured to a board, the plurality of components distributed over an area;
   a module secured to the board among the plurality of components and occupying a first portion of the area;
   a distributor plate in thermal contact with the module and secured to at least one of the module and the board having the module positioned between the distributor plate and the board, the distributor plate being parallel to the board and extending over a second portion of the area that is larger than the first portion of the area and includes the first portion of the area; and
   a plurality of heat pipes in thermal contact with the distributor plate;
   wherein the distributor plate has a first edge and a second edge, the first portion being closer to the first edge than the second edge, the distributor plate further defining a third portion that excludes the first portion; and
   wherein the plurality of heat pipes include a first heat pipes that are perpendicular to the second edge along an entire extent thereof and second heat pipes that each include:
      a first part perpendicular to the second edge and located over the third portion of the area;
      a second part parallel to the second edge and located over the first portion of the area, the second part being perpendicular to the first part; and
      a third part that is curved and extends between the first and second parts;
   wherein the first, second, and third parts of the second heat pipes and the first heat pipes are coplanar.

2. The thermal management system of claim 1, further comprising a plurality of fins extending from the distributor plate toward the board, the plurality of fins defined over a third portion of the area that excludes the first portion of the area and extends outwardly from the first portion of the area.

3. The thermal management system of claim 2, wherein the plurality of components have varying heights and wherein the plurality of fins have varying heights conforming to the plurality of components.

4. The thermal management system of claim 1, wherein the plurality of heat pipes are embedded in the distributor plate.

5. The thermal management system of claim 1, wherein the plurality of heat pipes extend from the first portion of the area to the third portion of the area.

6. The thermal management system of claim 5,
wherein the plurality of heat pipes extend from the first portion of the area toward a second edge of the area opposite the first edge.

7. The thermal management system of claim 6, wherein the plurality of heat pipes each include a straight portion perpendicular to the second edge and located adjacent the second edge.

8. The thermal management system of claim 6, wherein the distributor plate further defines an aperture sized to receive a component of the plurality of components, the aperture being positioned between the module and the second edge; and
wherein the plurality of heat pipes extend around the aperture;
wherein the aperture is positioned between the first heat pipes and the first parts of the second heat pipes.

9. The thermal management system of claim 7, wherein the board is mounted within a chassis having an air source mounted thereto, wherein the first heat pipes and first parts of the second heat pipes are substantially perpendicular to a direction of air flow induced by the air source across the board.

10. The thermal management system of claim 1, further comprising a back plane secured along an edge of the board and defining a plurality of ports, the distributor plate being fastened to the back plane.

11. The thermal management system of claim 1, further comprising a thermally conductive pad positioned between the distributor plate and the module.

12. The thermal management system of claim 1, wherein the board defines an aperture within the first portion of the area, a heat sink being secured to at least one of the board and the module and being in thermal contact with the module through the aperture.

13. The thermal management system of claim 12, wherein the heat sink defines a protrusion secured to and extending from a first surface and a plurality of fins secured to a second surface opposite the first surface, the protrusion sized to extend through the aperture.

14. The thermal management system of claim 1, further comprising a chassis defining a plurality of slots distributed along a lateral direction and having a slot pitch, the board and distributor plate being secured within a slot of the plurality of slots;
wherein a total extent of the board and distributor plate along the lateral direction is less than the slot pitch.

15. The thermal management system of claim 1, wherein the module is a 100G Long Haul Multi Source Agreement Module.

16. A heat distributor plate comprising:
a first portion defined by a first surface of the plate and sized to interface with a surface of an electronic module, the first surface defining a second portion exclusive of the first portion;
a plurality of fins extending from the second portion of the first surface; and
a plurality of heat pipes embedded in the heat distributor plate and each including a first part extending over the first portion and a second part extending over the second portion;
wherein the distributor plate further defines an aperture sized to receive a component of the plurality of components, the aperture being positioned between the module and the second edge; and
wherein the plurality of heat pipes extend around the aperture, the plurality of heat pipes being coplanar in a plane and including curved portions extending around the aperture, the curved portions also being coplanar with the plane.

17. The heat distributor plate of claim 16, wherein the first portion is located closer to a first edge of the plate than to a second opposing edge; and
wherein the plurality of heat pipes extend from the first portion toward the second edge.

* * * * *